United States Patent [19]
Ovens

[11] Patent Number: 4,737,665
[45] Date of Patent: Apr. 12, 1988

[54] ADJUSTABLE SPEED UP CIRCUIT FOR TTL-TYPE GATES

[75] Inventor: Kevin M. Ovens, Garland, Tex.

[73] Assignee: Texas Instruments Incorporated, Dallas, Tex.

[21] Appl. No.: 51,225

[22] Filed: May 12, 1987

Related U.S. Application Data

[63] Continuation of Ser. No. 692,581, Jan. 15, 1985, abandoned.

[51] Int. Cl.[4] ............... H03K 19/013; H03K 19/088; H03K 17/04; H03K 17/60
[52] U.S. Cl. ................................ 307/456; 307/458
[58] Field of Search .................. 307/456–458, 307/443, 473, 254, 270, 475

[56] References Cited

U.S. PATENT DOCUMENTS

| | | | |
|---|---|---|---|
| 3,510,685 | 5/1970 | Watanabe et al. | 307/456 |
| 3,867,644 | 2/1975 | Cline | 307/457 X |
| 4,180,750 | 12/1979 | Ozawa et al. | 307/362 |
| 4,255,670 | 3/1981 | Griffith | 307/473 |
| 4,449,063 | 5/1984 | Ohmichi et al. | 307/456 |
| 4,585,953 | 4/1986 | Gaudenzi et al. | 307/456 X |

FOREIGN PATENT DOCUMENTS

| | | | |
|---|---|---|---|
| 0032043 | 7/1981 | European Pat. Off. | |
| 0148475 | 7/1985 | European Pat. Off. | 307/456 |
| 54-152955 | 12/1979 | Japan. | |

*Primary Examiner*—Stanley D. Miller
*Assistant Examiner*—David R. Bertelson
*Attorney, Agent, or Firm*—Thomas R. FitzGerald; Richard A. Bachand; Leo N. Heiting

[57] ABSTRACT

The specification discloses a transition speed up circuit including an input transistor (14) for receiving a variable input voltage. An output transistor (16) is connected to the input transistor (14) to receive turn on current. A first diode (32) is connected at its cathode to the collector of the input transistor (14). A resistor (46) is connected between the anode of diode (32) and the output terminal (18). A speed up transistor (42) is connected at its emitter to the collector of input transistor (14) to supply speed up current through input transistor (14) to output transistor (16). A second diode (44) is connected between the base of speed up transistor (42) and the junction of first diode (32) and resistor (46). The speed up current terminates when the voltage at the output terminal (18) falls to a level determined by the value of resistor (46).

8 Claims, 2 Drawing Sheets

ADJUSTABLE SPEED UP CIRCUIT FOR TTL-TYPE GATES

This application is a continuation of application Ser. No. 692,581, filed Jan. 15, 1985, now abandoned.

BACKGROUND OF THE INVENTION

Many circuits are commonly used for electronic devices wherein it is important that a rapid transition be made from one voltage level to another. For example, output circuits are often used for converting from STL levels of internal logic to TTL levels necessary on circuit output pins. A typical output circuit for a TTL gate might normally have a low voltage level input and a high voltage output. If a high voltage input occurs, it is important that the output circuit provide a very fast transition to a low output. It is also important that such output circuits be able to drive high capacitive loads.

Previously developed output circuits for TTL gates have been developed with "speed up" elements which apply extra speed up current to an output transistor during output transition. However, such prior speed up circuits do not apply speed up current for a sufficiently long time or of a sufficiently high magnitude. Moreover, previously developed speed up circuits have been provided with a fixed threshold voltage for termination of speed up current. A need has thus arisen for a speed up output circuit which not only supplies a speed up current for a substantial period of time in order to provide rapid output transition, but which also allows easy variability of the length of time the turn off current is applied.

SUMMARY OF THE INVENTION

In accordance with the present invention, an output speed up circuit has been developed which substantially eliminates or minimizes the problems associated with previously developed output speed up circuits. The present speed up circuit includes an input transistor for receiving input voltage transitions. An output transistor is coupled to the input transistor and is responsive to an input voltage transition to change impedance state. A speed up amplification element is connected to the input transistor for applying added drive current through the input transistor to the output transistor in response to an input voltage transition. The amplication element applies the added drive current until the voltage at the output of the output transistor falls to a predetermined voltage level. The circuitry is provided to vary the predetermined voltage level to vary the change of impedance state of the output transistor.

In accordance with another aspect of the invention, a transition speed up circuit includes an input transistor having a base connected to receive a variable input voltage. An output transistor includes a base connected to the emitter of the input transistor to receive turn on current. A first diode is connected at its cathode to the collector of the input transistor. A resistor is connected to the anode of the diode. A speed up transistor includes an emitter connected to the collector of the input transistor for supplying speed up current through the input transistor to the output transistor. A second diode has an anode connected to the base of the speed up transistor and includes a cathode connected to the junction of the first diode and the resistor. The speed up current terminates when the voltage at the collector of the output transistor falls to a level determined by the value of the resistor.

BRIEF DESCRIPTION OF THE DRAWINGS

For a more detailed explanation of the present invention and for further objects and advantages thereof, reference is now made to the following drawings, taken in conjunction with the accompanying description.

DETAILED DESCRIPTION OF THE INVENTION

Figure 1:
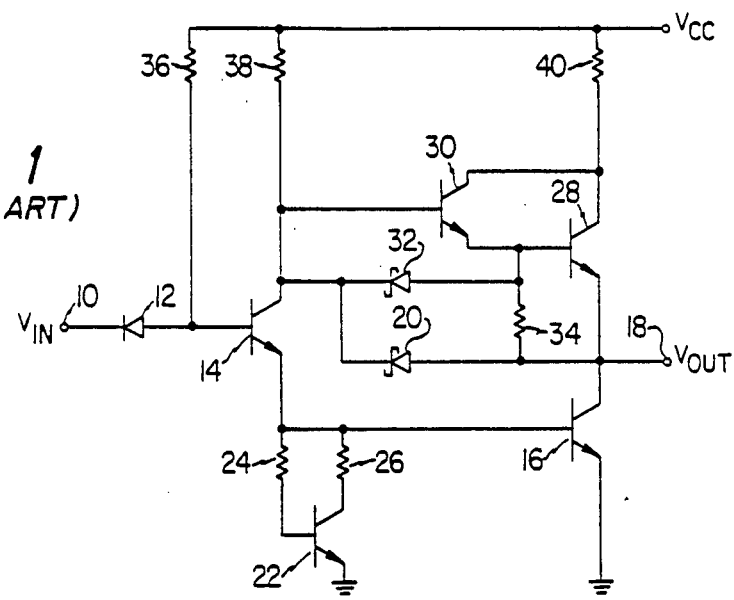
FIG. 1 illustrates the circuitry of a prior art speed up circuit for use with a TTL gate.

FIG. 1 is a schematic diagram of a prior art speed up circuit. A high or low voltage at input terminal 10 is applied through a diode 12 to the base of an input transistor 14. The emitter of input transistor 14 is connected to the base of an output transistor 16. The collector of transistor 16 is connected to an output terminal 18 to provide a desired output voltage to TTL circuitry.

A speed up Schottky diode 20 is connected between the collectors of input transistor 14 and output transistor 16. Diode 20 provides additional or speed up current to the base of the output transistor 16 through input transistor 14 during turn on, to cause transistor 16 to become conductive more rapidly in response to voltage transitions received at input voltage terminal 10.

As the prior art circuit of FIG. 1 is often driven by STL gates which have insufficient drive, an active turn off transistor 22 may be connected through resistors 24 and 26 to the base of output transistor 16. Also, as a part of a typical turn off circuit, a Darlington pair transistor configuration is provided which includes a transistor 28 connected at its emitter to the output terminal 18 and a transistor 30 connected across the base and collector of transistor 28. A Schottky diode 32 is connected between the emitter of transistor 30 and the collector of input transistor 14. A resistor 34 is connected between the anodes of diodes 20 and 32. Resistors 36, 38 and 40 provide suitable biasing to the transistors of the circuit.

In operation of the prior art circuit of FIG. 1, assume that the input voltage applied to terminal 10 is low and the output voltage at terminal 18 is high. Transistors 14, 16 and 22 are thus nonconductive. When the input voltage applied to terminal 10 transitions to a high state, the transistor 14 becomes conductive and applies current from its emitter to the base of the output transistor 16. In addition, speed up base current is applied to output transistor 16 through transistor 14 from diode 20, which also begins conduction. In response to the base current, the output transistor 16 begins to conduct, and the output voltage at terminal 18 begins to drop until finally diode 20 stops conduction. This reduces the initial speed up current applied to the base of transistor 16. At this point, the only source of turn on current being applied to output transistor 16 is through the resistor 38 source and transistor 14.

It may be shown that diode 20 terminates conduction when the output voltage at terminal 18 equals the base-emitter voltage of output transistor 16 plus the on voltage of input transistor 14 plus the diode voltage of diode 20. Since the on voltage of input transistor 14 approximately equals a transistor base-emitter voltage minus the diode 20 voltage, then the output voltage for turning diode 20 off may be shown to be approximately twice the base-emitter voltage of the output transistor 16. In other words, diode 20 becomes nonconductive and stops applying speed up current when the output voltage at terminal 18 reaches approximately twice the base-emitter voltage of output transistor 16. In a typical circuit, the threshold voltage for termination of turn off current will be approximately 1.7 volts.

This threshold value of prior speed up circuits has been found to be excessively high for optimum performance, as speed up current is not applied long enough to the output transistor 16, thus lengthening the turn off time of the circuit. Moreover, the additional speed up current applied to transistor 16 is limited by the $h_{FE}$ of transistor 14. Since transistor 14 normally supplies turn on current to output transistor 16 through resistor 34, this tends to reduce the additional turn on current available for transistor 16.

Figure 2:
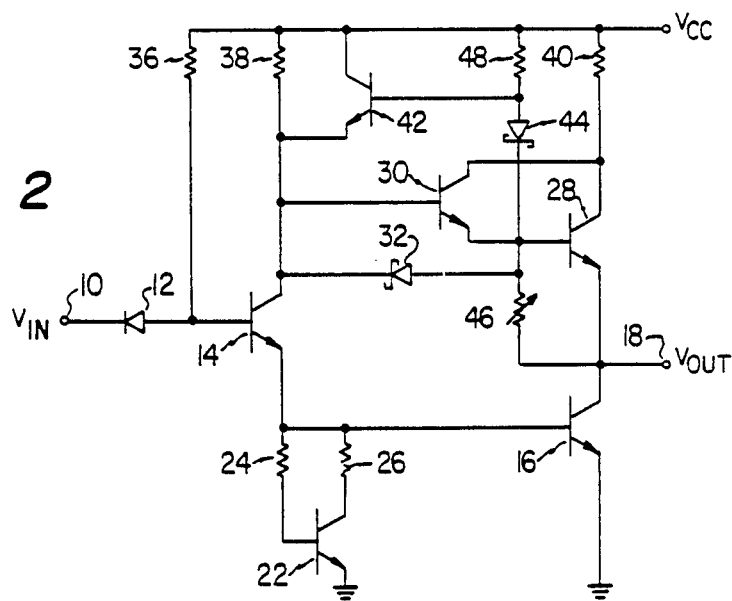
FIG. 2 is a schematic circuit of the preferred embodiment of the present improved speed up circuit.

FIG. 2 illustrates an improved circuit in accordance with the present invention wherein like numerals are used for like and identical components shown in FIG. 1. FIG. 2 illustrates the voltage input terminal 10, input diode 12 and input transistor 14. Likewise, the emitter of transistor 14 is connected to the base of the output transistor 16, the collector of which is applied to output terminal 18 to provide a voltage output. Transistor 22 is connected at its emitter and collector through resistors 24 and 26 to the base of transistor 16. A Darlington pair formed from transistors 28 and 30 is connected to the collector of transistor 16. Biasing resistors 36, 38 and 40 are connected similarly as in FIG. 1.

In FIG. 2, however, the speed up diode 20 has been eliminated and replaced by a speed up transistor 42 connected at its emitter to the collector of input transistor 14. The base of transistor 42 is connected to the anode of a Schottky diode 44, the cathode of which is connected to the base of transistor 28 and the anode of diode 32. The cathode of diode 44 is also connected to a variable resistor 46 which is connected directly to output terminal 18. Resistor 46 is illustrated as being variable in order to adjust the turn off termination voltage threshold of the circuit. A resistor 48 is connected between the bias voltage and the base of transistor 42 and the anode of diode 44.

In operation of the improved speed up circuit of FIG. 2, assume that the voltage applied to the input terminal 10 is low and the voltage at output terminal 18 is high. Transistors 14, 16, 22 and 42 are nonconductive at this stage. When a high voltage input is applied to the input terminal 10, transistor 14 turns on to supply base drive to transistor 16. Transistor 42 also becomes conductive since the voltage drop across diodes 44 and 32 is insufficient to cause transistor 42 to become nonconductive. The conduction of transistor 42 supplies added or speed up drive current through transistor 14 to the base of transistor 16. This causes transistor 16 to become conductive more rapidly.

As transistor 16 becomes conductive, the voltage at output terminal 18 falls. When the voltage output reaches a threshold determined by the values of the circuit, current through resistor 46 causes the transistor 42 base drive to be diverted and thus renders transistor 42 nonconductive. This terminates the flow of speed up current to transistor 16 and the slope of the output voltage changes to a less rapid turn off slope, since the only remaining base turn off current is generated from transistor 14.

As previously noted with prior art turn off output circuits, the threshold voltage at which the added turn off current was generated occurred at about a voltage output of two base-emitter transistor voltages, or approximately 1.7 volts. With the circuits shown in FIG. 2, the voltage threshold at which speed up transistor 42 is rendered nonconductive occurs at:

$$V_T = V_{BE(16)} + V_{ON(14)} + V_{BE(42)} - V_{A(44)} - V_{R(46)}$$

It may be seen that the voltage across resistor 46 may be adjusted to substantially lower the voltage threshold below two base-emitter transistor voltages, thereby representing a substantial improvement in turn off times over prior art devices. For example, if the voltage across resistor 46 is set to be about 0.4 volt, and assuming the base-emitter voltage to transistor 16 to be equal to approximately 0.8 volt, the transistor 14 on voltage to be equal to approximately 0.2 volt and the diode 44 voltage to be approximately 0.6 volt, then the voltage threshold of the circuit is lowered to approximately 0.8 volt, or less than half the threshold voltage of prior art circuits. If diode 44 is converted to a base-emitter diode, the voltage threshold can be lowered even further to approximately 0.6 volt.

An important aspect of the present circuit is that the resistor 46 may be varied in order to change the output threshold level at which speed up current is applied. Consequently, the turn off characteristics of the circuit can be selectively varied.

Although resistor 46 is illustrated with a terminal connected to output terminal 18, it should be understood that the circuit will also operate with the terminal of resistor 46 connected to circuit ground. In addition, a current limiting resistor may be added to the collector of transistor 42, if desired. The circuit of FIG. 2 may also be utilized with open collector type output circuits by the utilization of one or two diodes in series to adjust the threshold voltage at which transistor 42 becomes nonconductive.

It may thus be seen that the present invention provides a speed up current for an extended period of time in order to provide a fast transition of an output transistor in a TTL output circuit. The present invention substantially lowers the threshold voltage at which turn off of the speed up device occurs. The utilization of an active gain device such as transistor 42 in place of the previous used diode provides enhanced magnitude of speed up current, thereby further decreasing the turn off time of the circuit. The utilization of the variable resistor 46 enables the turn off characteristics of the circuitry to be selectively varied.

Although the preferred embodiment has been described in detail, it should be understood that various changes, substitutions and alterations can be made therein without departing from the spirit and scope of the invention as defined by the appended claims.

What is claimed is:

1. A transition speed up circuit comprising:
    an input transistor for receiving input voltage transitions and for producing a drive current in response thereto:
    a pull down transistor coupled between an output node and ground and to said input transistor and operative to receive the drive current from said input transistor and in response thereto to conduct current from the output node to ground;
    a pull up transistor coupled between said output node and a source of high voltage and operative to conduct current from said high voltage source to said output node in response to pull up base current applied to a base thereof;

a current amplifier having an output coupled to a a base of said pull up transistor for providing current drive thereto;

a unidirectional conductive element connected from said base of said pull up transistor to said input transistor for applying added drive current through said input transistor to said pull down transistor in response to said input voltage transition, said conductive element applying said added drive current until the output voltage of said pull down transistor falls to a predetermined voltage level; and an adjustable conductance path from said base of said pull up transistor to said output node for adjustably establishing the the amount by which a final low output voltage level is below said predetermined voltage level.

2. The circuit of claim 1, including a speed up transistor connected to said input transistor for providing added current drive through said input transistor to said pull down transistor and a bias current path from a source of high voltage to said pull up current base.

3. The circuit of claim 2, wherein said adjustable conductance path is a variable resistor.

4. The circuit of claim 3, wherein said current amplifier is a transistor coupled to said pull up transistor so as to form a Darlington pair with an emitter connected to the base of said pull up transistor and a collector connected to a collector of said pull up transistor and a base connected to a collector of said input transistor.

5. The circuit of claim 1, wherein said unidirectional conductive element is a Schottky diode.

6. A transition speed up circuit comprising:

an input transistor connected to receive input voltage at a first electrode thereof;

an pull down transistor connected to a second electrode of said input transistor to receive current from said input transistor, to an output node and to ground so as to pull down said output node in response to current received from said second electrode;

a speed up transistor connected to a third electrode of said input transistor for supplying speed up current through said input transistor to said output transistor;

a pull up transistor coupled between an output node and a source of high voltage and operative to pull up said output node in response to being rendered conductive;

a current amplifying transistor coupled to said pull up transistor in a Darlington pair;

a Schottky diode having an anode coupled to a base of said pull up transistor and a cathode coupled to a collector of said input transistor;

a variable resistor coupled from said base of said pull up transistor to said output node.

7. The circuit of claim 6, including a resistor connected from the source of high voltage to a base of said speed up transistor and a Schottky diode connected from said speed up transistor base to said pull up transistor base.

8. The circuit of claim 6, wherein said speed up transistor has an emitter connected to a collector of said input transistor, a collector connected to said source of high voltage.

* * * * *